United States Patent
Hsieh et al.

(10) Patent No.: US 8,667,349 B2
(45) Date of Patent: Mar. 4, 2014

(54) SCAN FLIP-FLOP CIRCUIT HAVING FAST SETUP TIME

(75) Inventors: Shang-Chih Hsieh, Yangmei (TW); Chih-Chiang Chang, Zhudong Township (TW); Chang-Yu Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 392 days.

(21) Appl. No.: 13/207,494

(22) Filed: Aug. 11, 2011

(65) Prior Publication Data

US 2013/0042158 A1  Feb. 14, 2013

(51) Int. Cl.
*G01R 31/28* (2006.01)

(52) U.S. Cl.
USPC .......................................... 714/726

(58) Field of Classification Search
USPC ............... 714/726, 724, 733, 734, 30
See application file for complete search history.

(56) References Cited

U.S. PATENT DOCUMENTS

| | | | | |
|---|---|---|---|---|
| 5,257,223 A * | 10/1993 | Dervisoglu | ................... | 365/154 |
| 5,469,079 A * | 11/1995 | Mahant-Shetti et al. | ....... | 326/46 |
| 5,689,517 A * | 11/1997 | Ruparel | ......................... | 714/731 |
| 6,006,348 A * | 12/1999 | Sode et al. | .................... | 714/731 |
| 6,181,179 B1 | 1/2001 | Kanba | | |
| 6,456,113 B2 * | 9/2002 | Kanba | ............................. | 326/93 |
| 6,873,197 B2 * | 3/2005 | Kanba | .......................... | 327/202 |
| 7,353,441 B2 * | 4/2008 | Hirano | ......................... | 714/726 |
| 7,358,786 B2 * | 4/2008 | Kim | ................................ | 327/202 |
| 8,458,540 B2 * | 6/2013 | Inagawa | ....................... | 714/726 |
| 2002/0087930 A1 * | 7/2002 | Kanba | ........................... | 714/726 |
| 2003/0066002 A1 * | 4/2003 | Kanba | ........................... | 714/726 |
| 2005/0268191 A1 * | 12/2005 | Shin | ............................. | 714/726 |
| 2007/0162802 A1 * | 7/2007 | Miwa | ............................ | 714/726 |

* cited by examiner

*Primary Examiner* — Phung M Chung
(74) *Attorney, Agent, or Firm* — Duane Morris LLP

(57) ABSTRACT

A scan-flip flop circuit includes an input stage for providing a data signal to a data node, wherein the input stage includes first and second stacks of transistors devices coupled to the data node. The first stack receives a data input signal during a normal operation mode for input to the data node, and the second stack receiving a scan input signal during a scan test mode for input to the data node. The scan flip-flop circuit also includes a master latch coupled directly to the data node for latching the data signal from the input stage and outputting the data signal; a slave latch coupled to an output of the master latch for latching the output from the master latch and outputting the output; and a scan and clock control logic module. The scan and clock control logic module controls the first stack to input the data input signal to the data node during normal operation mode.

21 Claims, 1 Drawing Sheet

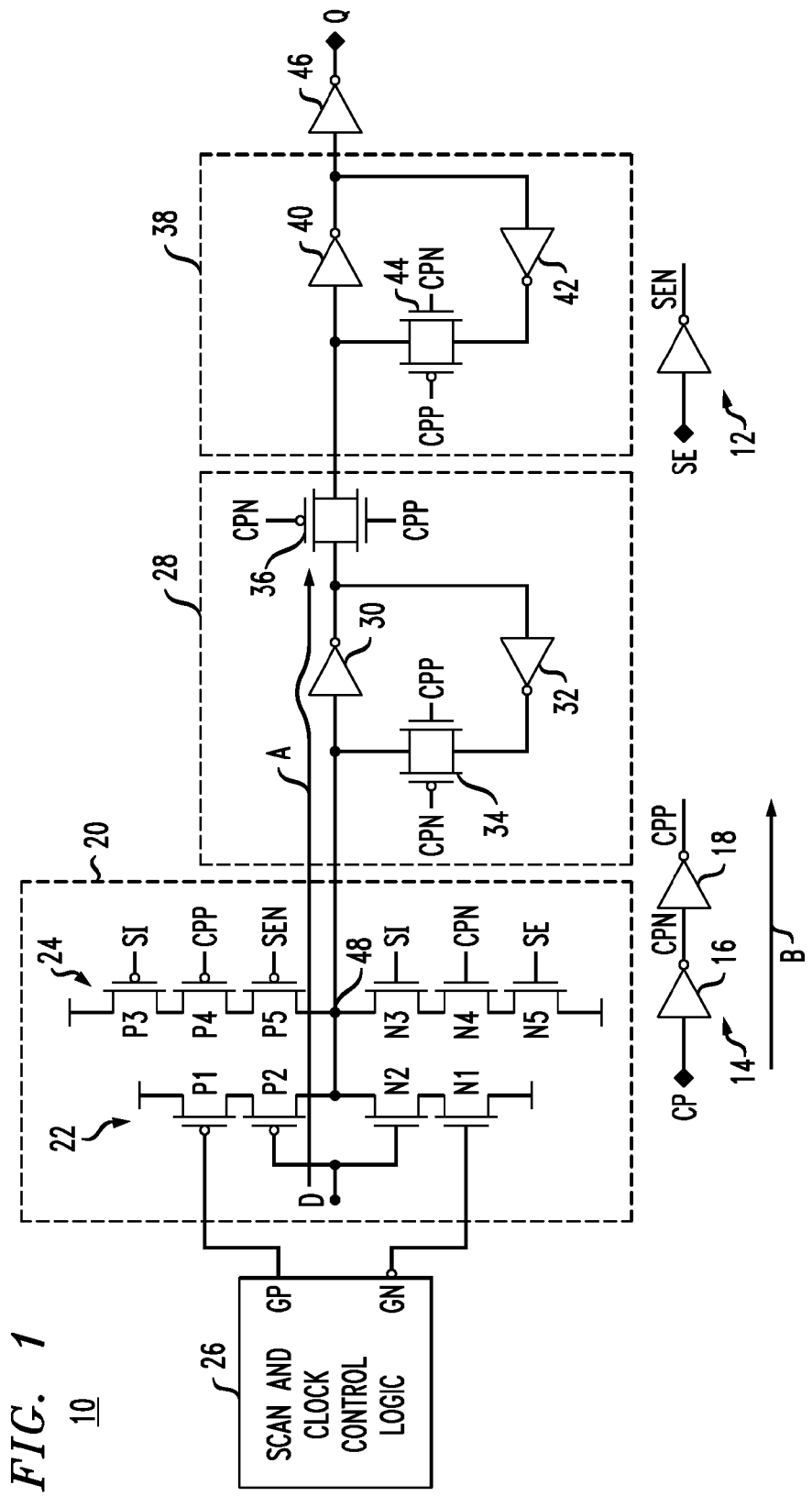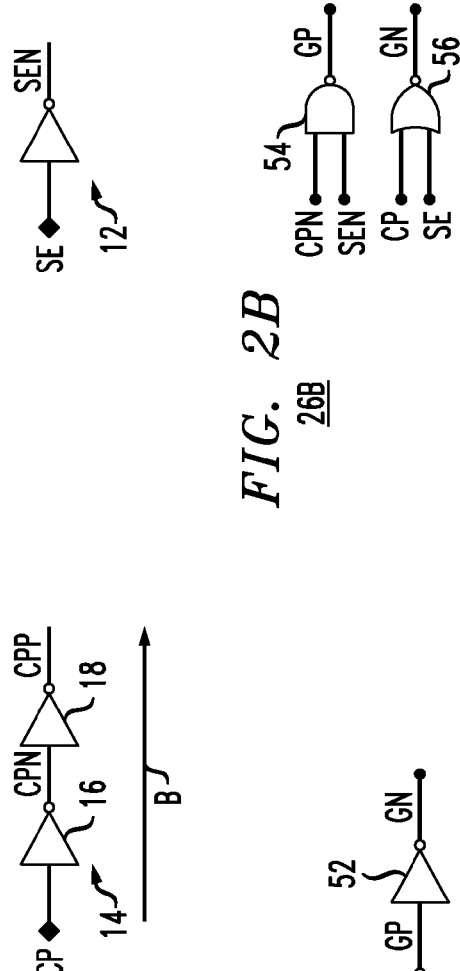

8,667,349 B2

SCAN FLIP-FLOP CIRCUIT HAVING FAST SETUP TIME

TECHNICAL FIELD

The present invention relates to scan flip-flop circuits and, more particularly, to scan flip-flop circuits used to perform a scan test for a semiconductor integrated circuit.

BACKGROUND OF THE INVENTION

The data setup time in traditional scan flip-flops is not fast enough for multi-gigahertz CPUs. Even using aggressive sizing techniques, improvement is limited due to the circuit structure of the traditional scan flip-flop. Other approaches use complex control schemes and related area intensive latch structures, but provide minimal timing improvements.

Improvements in scan flip-flops are desired.

BRIEF DESCRIPTION OF THE DRAWINGS

The accompanying drawings illustrate preferred embodiments of the invention, as well as other information pertinent to the disclosure, in which:

FIG. 1 is a circuit diagram of an embodiment of a scan flip-flop circuit; and

FIGS. 2A and 2B illustrate embodiments of the scan and clock control logic circuit of the scan and flip-flop circuit of FIG. 1.

DETAILED DESCRIPTION

This description of the exemplary embodiments is intended to be read in connection with the accompanying drawings, which are to be considered part of the entire written description. In the description, terms concerning coupling and the like, such as "coupled", "connected" and "interconnected," refer to a relationship wherein structures communicate with one another either directly or indirectly through intervening structures unless expressly described otherwise.

FIG. 1 is a circuit diagram of an embodiment of a scan flip-flop circuit 10. The scan flip-flop circuit 10 uses a two stage input stage 20 with a two gate stack first stage to speed up fetching of data to the slave latch. A scan and clock control logic module 26 is used to eliminate the need for a transmission gate in the master latch 28 coupled to the input stage 20. In prior art circuits, this transmission gate is a source of propagation delay that limits the scan flip-flop setup time and thus the scan-flip flop's use in or with higher speed multi-gigahertz processors.

With more specific reference to the scan flip-flop circuit 10 of FIG. 1, the scan flip-flop circuit 10 includes, from left to right, a scan and clock control logic module (SCCL) 26 coupled to a two stage input stage 20, a master latch 28 coupled directly to the data output node 48 of the two stage input stage 20, and a slave latch 38 coupled to the output of the master latch 28. The scan flip-flop circuit 10 also includes a clock circuit 14 for generating a pair of logically inverted clock signals for controlling transmission gates within the master and slave latches 28, 38 and the input stage 20. A clock signal CP is input to a first inverter 16 of the clock circuit 14 to output the logically inverted signal as a clock signal CPN. The clock signal CPN is input to second inverter 18 to output the logically inverted signal as clock signal CPP. Two inverters are used to generate the internal CPN and CPP signal to avoid directly coupling the incoming clock signal to the internal transmission gates, making the speed less sensitive to clock transition time variation. The scan flip-flop circuit 10 also includes an inverter 12 for providing a logically inverted scan enable signal as signal SEN from scan enable signal SE.

Two stage input stage 20 includes a data input stage 22 formed from a first stack of transistors including PMOS transistors P1, P2 and NMOS transistors N1, N2 and a scan input 24 stage formed from second stack of transistors including PMOS transistors P3, P4, P5 and NMOS transistors N3, N4, N5. Within the data input stage 22, transistors P1, N1 form a first logic gate, specifically a first CMOS pair of transistors, coupled to a pair of logically inverted control signals. More specifically, the gate of the P1 is coupled to control signal GP and the gate of N1 is coupled to control signal GN. Transistors N2, P2 form a second logic gate, specifically a CMOS transistor inverter pair. The gates of transistors N2 and P2 are coupled to data input D.

Within the scan input stage 24, transistors P3, N3 form a CMOS transistor pair, transistors P4, N4 form a CMOS transistor pair and transistors P5, N5 form a CMOS transistor pair. The gates of transistors N3 and P3 are coupled to the scan data input signal SI; the gates of transistors N4 and P4 are coupled to the clock signals CPN and CPP, respectively; and the gates of the transistors N5 and P5 are coupled to the scan enable SE and scan enable inverse SEN signals, respectively.

The master latch 28 includes a first pair of cross-coupled inverters 30, 32, with the input of inverter 30 directly coupled to the data output node of the two stage input stage 20 and to the output of the inverter 32 via first CMOS transmission gate 34. The output of the inverter 30 is coupled to a second CMOS transmission gate 36 and to the input of the inverter 32. Transmission gates 34, 36 are closed (i.e., conductive) when CP is high, meaning CPN is low and CPP is high.

The slave latch 38 includes a second pair of cross-coupled inverters 40, 42 and a third CMOS transmission gate 44. The input of the inverter 40 is coupled to the output of the master latch 28 and to the output of inverter 42 via third CMOS transmission gate 44. The output of inverter 40 is coupled to the input of inverter 42 and to output inverter 46, which provides output data signal Q.

The setup time for normal data mode is defined as the delay through path A (labeled in FIG. 1) minus the delay through path B (also labeled in FIG. 1). Path B is the path through inverters 16 and 18 for establishing clock signal CPP. Path A is the data path from data input D, through the data input stage 22 of two stage input stage 20, and through inverter 30 of the master latch 28. In prior art scan flip-flops, path A is much slower than path B, due in large part to the presence of a transmission gate disposed between the input stage and the inverter 30 of the master latch. As can be seen from FIG. 1, the master latch 28 does not include a delay inducing transmission gate disposed between the data node 48 of input stage and the input of the inverter 30 of the master latch 28. This reduces the propagation time in path A, and thus the setup time (delay through path A minus delay through path B). Moreover, the data input stage 22 is composed of only two logic gates, while prior art designs use a stack of three CMOS logic gate (like the scan input stage 24 of the input stage 20). The purpose of using a two stack gate rather than a conventional three stack gate in the data input stage 22 is speed. It should be noted that the setup time for scan test mode, which uses three logic gate stack 24, is not a concern of the design since scan operations use slower clock speeds and is not a design concern.

The SCCL circuit 26 provides logically inverted control signal pair GP, GN to the first stack 22 of the input stage 20. Specifically, control signal pair GP, GN controls the data input stage 22 to transmit data signal D during normal operation mode when both SE is logic low (SEN is logic high) and the clock signal CPN is logic high (CPP is logic low). Otherwise, during scan test mode, i.e., when SE is logic high (SEN logic low), the scan input stage 24 is operational to pass scan input SI when the clock signal CPN is logic high (CPP is logic low).

FIGS. 2A and 2B illustrate alternative embodiments of SCCL circuit 26. It should be understood that these are only two illustrative embodiments and other approaches for performing the required logic function may be employed. FIG. 2A illustrates an embodiment of a SCCL circuit 26A that includes a NAND logic gate 50 coupled to an inverter 52. NAND logic gate 50 has inputs coupled to clock signal CPN and scan enable signal SEN to provide control signal GP, which is logic low only when both CPN and SEN are logic high and is otherwise is logic high. Control signal GN is the inverse of control signal GP via operation of inverter 52. With GP at logic low only when CPN and SEN are logic high, the data input stage 22 passes data signal D only when CPN is high during normal operation mode (i.e., when SE is low).

FIG. 2B illustrates an alternative embodiment of a SCCL circuit 26B that includes a NAND logic gate 54 and a NOR logic gate 56. NAND logic gate 54 operates in the same manner as NAND logic gate 50 to ensure GP is low only when CPN and SEN are logic high. Control signal GN should be the opposite logic level to the control signal GP. This logic condition is provided by NOR logic gate 56, which has scan enable signal SE and clock signal CP as inputs. NOR logic gate 56 outputs logic 1 only when both CP and SE are logic low, i.e., when CPN and SEN are logic high.

The operation of the scan flip-flop circuit of FIG. 1 is now described. In normal operation mode, signal SE is low and signal SEN is high. With SE low and SEN high, the scan input stage 24 of the two stage input stage 20 is not operational, i.e., cannot pass scan data SI. Rather, with SEN high, when clock signal CPN goes logic high, GP goes low and GN goes high. Control signals GP, GN turn on transistors P1, N1, respectively, to input data D from the input stage 20 to data node 48 and thus directly to the inverter 30 of master latch 28. With CPN at logic high (CPP at logic low), transmission gate 36 is open, disconnecting master latch 28 from slave latch 38. Transmission gate 34 is also open, disconnecting the input of inverter 30 from the output of inverter 32.

Clock signal CPN then goes logic low (CPP at logic high), which turns on transmission gates 34 and 36. This connects inverters 30 and 32 together in master latch 28 to latch and hold the output of inverter 30 in master latch 28. With transmission gate 36 on at this time, the output of inverter 30 is also input to the slave latch 38. Inverters 40 and 46 invert this input to provide output Q. Control signal GP is at logic high (GN at logic low), so no data D is passed to the data node 48 by the input stage 20.

Clock signal CPN then goes logic high (CPP at logic low), which switches GP to logic low (GN to logic high) to pass the next data D to the master latch 28. This also opens transmission gate 36 to disconnect slave latch 38 from master latch 28, and closes transmission gate 44 to latch the output of inverter 40 by the slave latch 38, which is inverted by inverter 46 and output as data signal Q. Inverter 46 is used to restore the logic sate of data D, since the input stage 20 acts as an inverter.

Simulations of the scan flip-flop disclosed herein confirmed significant improvements in the setup time over the setup time of conventional scan flip-flops.

The proposed scan flip-flop circuit has fast setup time, which improves the register-to-register path delay for high speed applications. The new circuit structure does this by prioritizing the data-in path over the scan-in path, resulting in a significant improvement in setup time. Setup time is an important consideration in CPU operating frequency, and this robust design can be used to improve CPU operating frequency. Moreover, the design can be used to improve the operation of other circuits, such as communications circuits, arithmetic processors and other high speed circuits and devices.

In an embodiment of a scan flip-flop circuit described herein, the scan-flip flop circuit includes an input stage for providing a data signal to a data node, wherein the input stage includes first and second stacks of transistors devices coupled to the data node. The first stack receives a data input signal during a normal operation mode for input to the data node, and the second stack receiving a scan input signal during a scan test mode for input to the data node. The scan flip-flop circuit also includes a master latch coupled directly to the data node for latching the data signal from the input stage and outputting the data signal; a slave latch coupled to an output of the master latch for latching the output from the master latch and outputting the output; and a scan and clock control logic module. The scan and clock control logic module controls the first stack to input the data input signal to the data node during normal operation mode.

In certain embodiments, the scan flip-flop circuit includes an input stage for providing a data signal to a data node having first and second stacks of transistors devices coupled to the data node, where the second stack includes a first pair of CMOS transistors responsive to a clock, a second pair of CMOS transistors responsive to a scan enable signal, and a third pair of CMOS transistors coupled to a scan input signal for input to the data node during a scan test mode, and the first stack consisting only of a fourth pair of CMOS transistors coupled to a pair of control signals and a fifth pair of CMOS transistors coupled to a data input signal for input to the data node during a normal operation mode. The circuit also includes a master latch coupled to the data node for latching the data signal from the input stage and outputting the data signal responsive to the clock; a slave latch coupled to an output of the master latch for latching the output from the master latch and outputting the output responsive to the clock; and a scan and clock control logic module for providing the pair of control signals.

In another embodiment, the scan flip-flop circuit includes an input stage for providing a data signal to a data node having first and second stacks of transistors devices coupled to the data node, where the second stack includes a first pair of CMOS transistors coupled to a pair of logically inverted clock signals, a second pair of CMOS transistors coupled to a pair of logically inverted scan enable signals, and a third pair of CMOS transistors coupled to a scan input signal for input to the data node during a scan test mode, and the first stack includes a fourth pair of CMOS transistors coupled to a pair of logically inverted control signals and a fifth pair of CMOS transistors coupled to a data input signal for input to the data node during a normal operation mode. The circuit also includes a master latch directly coupled to the data node for latching the data signal from the input stage and outputting the data signal responsive to the pair of logically inverted clock signals; a slave latch coupled to an output of the master latch for latching the output from the master latch and outputting the output responsive to the pair of logically inverted clock signals; and a scan and clock control logic module for providing the pair of logically inverted control signals. The scan and clock control logic module controls the first stack to input the data input signal to the data node only when a first one of the pair of logically inverted clock signals is logical high and the logically inverted scan enable signals represent normal operation mode.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A scan flip-flop circuit comprising:
an input stage for providing a data signal to a data node, wherein the input stage comprises first and second stacks of transistors devices coupled to the data node, the first stack receiving a data input signal during a normal operation mode for input to the data node, and the second stack receiving a scan input signal during a scan test mode for input to the data node;
a master latch coupled directly to the data node for latching the data signal from the input stage and outputting the data signal;
a slave latch coupled to an output of the master latch for latching the output from the master latch and outputting the output; and
a scan and clock control logic module, the scan and clock control logic module controlling the first stack to input the data input signal to the data node during normal operation mode.

2. The scan flip-flop circuit of claim 1, wherein the scan and clock control logic module controls the first stack to input the data input signal to the data node only when a clock signal is logical high and a scan enable signal represents normal data operation mode.

3. The scan flip-flop circuit of claim 1, wherein the first stack of transistors comprises a stack of four transistors, including first and second PMOS transistors stacked between the data node and a high supply voltage node and first and second NMOS transistors stacked between the data node and a low supply voltage node, wherein the second NMOS and PMOS transistors have gate terminals for receiving the data input signal during normal operation mode and the first NMOS and PMOS transistors have gate terminals coupled to the scan and clock control logic module.

4. The scan flip-flop circuit of claim 3, wherein the scan and clock control logic module provides control signals to gate terminals of the first NMOS and PMOS transistors.

5. The scan flip-flop circuit of claim 4, wherein the scan and clock control logic module includes a NAND logic gate and an inverter coupled to the output of the NAND logic gate, the NAND logic gate and inverter providing the pair of logically inverted control signals in response to a clock signal and an inverse scan enable signal.

6. The scan flip-flop circuit of claim 4, wherein the scan and clock control logic module includes a NAND logic gate for providing a first one of the pair of logically inverted control signals in response to a clock signal and an inverse scan enable signal, and a NOR logic gate for providing a second one of the pair of logically inverted control signals in response to an inverse clock signal and a scan enable signal.

7. The scan flip-flop circuit of claim 3, wherein the second stack comprises a stack of six transistors, including third, fourth and fifth PMOS transistors stacked between the data node and a high supply voltage node and first third, fourth and fifth NMOS transistors stacked between the data node and a low supply voltage node,
wherein the third NMOS and PMOS transistors have gate terminals for receiving the scan input signal during scan test mode,
wherein the fourth NMOS and PMOS transistors are responsive to a clock signal, and
and the fifth NMOS and PMOS transistors are responsive to a scan enable signal.

8. The scan flip-flop circuit of claim 1, further comprising a clock unit for supplying a pair of logically inverted clock signals to the input stage, master latch and slave latch.

9. The scan flip-flop circuit of claim 8, wherein the second stack of transistor devices comprises a first pair of complementary metal oxide semiconductor (CMOS) transistors coupled to the pair of logically inverted clock signals.

10. The scan flip-flop circuit of claim 9, wherein the second stack of transistor devices further comprises a second pair of CMOS transistors coupled to a pair of logically inverted scan enable signals.

11. The scan flip-flop circuit of claim 10, wherein the second stack of transistor devices further comprises a third pair of CMOS transistors coupled to the scan input signal.

12. The scan flip-flop circuit of claim 11, wherein the first stack of transistors comprises a fourth pair of CMOS transistors coupled to the data input signal and a fifth pair of CMOS transistors coupled to a pair of logically inverted control signals from the scan and clock control logic module.

13. The scan flip-flop circuit of claim 1, wherein the first stack of transistors comprises fewer logic gates than the second stack of transistors.

14. A scan flip-flop circuit comprising:
an input stage for providing a data signal to a data node, the input stage comprising first and second stacks of transistors devices coupled to the data node, the second stack including a first pair of complementary metal oxide semiconductor (CMOS) transistors responsive to a clock, a second pair of CMOS transistors responsive to a scan enable signal, and a third pair of CMOS transistors coupled to a scan input signal for input to the data node during a scan test mode, the first stack comprising a fourth pair of CMOS transistors coupled to a pair of control signals and a fifth pair of CMOS transistors coupled to a data input signal for input to the data node during a normal operation mode;
a master latch coupled to the data node for latching the data signal from the input stage and outputting the data signal responsive to the clock;
a slave latch coupled to an output of the master latch for latching the output from the master latch and outputting the output responsive to the clock; and
a scan and clock control logic module for providing the pair of control signals.

15. The scan flip-flop circuit of claim 14, wherein the master latch is directly coupled to the data node without an intervening transmission gate.

16. The scan flip-flop circuit of claim 14, wherein the clock comprises a pair of logically inverted clock signals and wherein the scan and clock control logic module controls the first stack to input the data input signal to the data node only when a first one of the pair of logically inverted clock signals is logical high and the scan enable signal represents normal operation mode.

17. The scan flip-flop circuit of claim 16,
wherein the control signals comprise a pair of logically inverted control signals,
wherein the scan enable signal comprises a pair of logically inverted scan enable signals, and wherein the scan and clock control logic module includes a NAND logic gate for providing a first one of the pair of logically inverted control signals in response to the first one of the pair of logically inverted clock signals and one of the pair of logically inverted scan enable signals.

18. The scan flip-flop circuit of claim 17, wherein the scan and clock control logic module further comprises an inverter for providing a second one of the pair of logically inverted control signals from the first one of logically inverted control signals.

19. The scan flip-flop circuit of claim 17, wherein the scan and clock control logic module further comprises a NOR logic gate for providing a second one of the pair of logically inverted control signals in response to a second one of the pair of logically inverted clock signals and the other one of the pair of logically inverted scan enable signals.

20. The scan flip-flop circuit of claim 14, wherein the clock comprises a pair of logically inverted clock signals, the scan flip-flop circuit further comprising a clock unit for supplying a pair of logically inverted clock signals to the input stage, master latch and slave latch.

21. A scan flip-flop circuit comprising:
an input stage for providing a data signal to a data node, the input stage comprising first and second stacks of transistors devices coupled to the data node, the second stack including a first pair of complementary metal oxide semiconductor (CMOS) transistors coupled to a pair of logically inverted clock signals, a second pair of CMOS transistors coupled to a pair of logically inverted scan enable signals, and a third pair of CMOS transistors coupled to a scan input signal for input to the data node during a scan test mode, the first stack consisting only of a fourth pair of CMOS transistors coupled to a pair of logically inverted control signals and a fifth pair of CMOS transistors coupled to a data input signal for input to the data node during a normal operation mode;
a master latch directly coupled to the data node for latching the data signal from the input stage and outputting the data signal responsive to the pair of logically inverted clock signals;
a slave latch coupled to an output of the master latch for latching the output from the master latch and outputting the output responsive to the pair of logically inverted clock signals; and
a scan and clock control logic module for providing the pair of logically inverted control signals, wherein the scan and clock control logic module controls the first stack to input the data input signal to the data node only when a first one of the pair of logically inverted clock signals is logical high and the logically inverted scan enable signals represent normal operation mode.

* * * * *